US012805327B2

(12) United States Patent
Chang et al.

(10) Patent No.: US 12,805,327 B2
(45) Date of Patent: Nov. 17, 2026

(54) STRESS BUFFER IN INTEGRATED CIRCUIT PACKAGE COMPRISING DIRECTLY BONDED INTEGRATED CIRCUIT DIES TO AN INTERPOSER

(71) Applicant: Taiwan Semiconductor Manufacturing Co., Ltd., Hsinchu (TW)

(72) Inventors: Hung-Pin Chang, New Taipei (TW); Cheng-Hsien Hsieh, Kaohsiung (TW); Li-Han Hsu, Hsinchu (TW); Wei-Cheng Wu, Hsinchu (TW); Der-Chyang Yeh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 392 days.

(21) Appl. No.: 18/451,269

(22) Filed: Aug. 17, 2023

(65) Prior Publication Data

US 2024/0413097 A1 Dec. 12, 2024

Related U.S. Application Data

(60) Provisional application No. 63/506,619, filed on Jun. 7, 2023.

(51) Int. Cl.
*H10W 42/00* (2026.01)
*H10W 72/30* (2026.01)
(Continued)

(52) U.S. Cl.
CPC ......... *H10W 42/121* (2026.01); *H10W 74/01* (2026.01); *H10W 74/117* (2026.01);
(Continued)

(58) Field of Classification Search
CPC ............. H10W 90/794; H10W 74/014; H10W 74/473; H10W 80/312; H10W 72/332;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

CN 110034026 A 7/2019
DE 102018124848 A1 6/2019
(Continued)

*Primary Examiner* — Didarul A Mazumder
(74) *Attorney, Agent, or Firm* — Slater Matsil, LLP

(57) ABSTRACT

In an embodiment, a package include an integrated circuit die comprising a first insulating bonding layer and a first semiconductor substrate and an interposer comprising a second insulating bonding layer and a second semiconductor substrate. The second insulating bonding layer is directly bonded to the first insulating bonding layer with dielectric-to-dielectric bonds. The package further includes an encapsulant over the interposer and surrounding the integrated circuit die. The encapsulant is further disposed between the first insulating bonding layer and the second insulating bonding layer along a line perpendicular to a major surface of the first semiconductor substrate.

20 Claims, 18 Drawing Sheets

(51) Int. Cl.

| | |
|---|---|
| ***H10W 74/01*** | (2026.01) |
| ***H10W 74/10*** | (2026.01) |
| ***H10W 74/47*** | (2026.01) |
| ***H10W 80/00*** | (2026.01) |
| ***H10W 90/00*** | (2026.01) |

(52) U.S. Cl.
CPC ........ *H10W 74/473* (2026.01); *H10W 72/332* (2026.01); *H10W 80/312* (2026.01); *H10W 80/327* (2026.01); *H10W 90/794* (2026.01)

(58) Field of Classification Search
CPC . H10W 80/327; H10W 42/121; H10W 74/01; H10W 74/117; H10W 72/90; H10W 70/65; H10W 70/05; H10W 70/685; H10W 72/0198; H10W 74/114; H10W 90/00; H10P 72/74
USPC ........................................... 257/668; 438/123
See application file for complete search history.

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 12,237,238 | B2 | 2/2025 | Lin et al. | |
| 2015/0194455 | A1* | 7/2015 | Ho ........................ | H10F 39/809<br>438/109 |
| 2017/0186798 | A1* | 6/2017 | Yang ..................... | H10F 39/805 |
| 2017/0338214 | A1* | 11/2017 | Uzoh .................. | H10W 74/014 |
| 2019/0164860 | A1* | 5/2019 | Lin ..................... | H10W 74/117 |
| 2019/0393189 | A1 | 12/2019 | Yu et al. | |
| 2021/0210399 | A1* | 7/2021 | Lin ..................... | H10W 74/117 |
| 2021/0233852 | A1 | 7/2021 | Yu et al. | |
| 2022/0238484 | A1 | 7/2022 | Chen et al. | |
| 2022/0310470 | A1 | 9/2022 | Chen et al. | |
| 2022/0310501 | A1* | 9/2022 | Wang .................. | H10W 42/121 |
| 2022/0375890 | A1 | 11/2022 | Chiou et al. | |
| 2023/0004310 | A1 | 1/2023 | Kondo et al. | |

FOREIGN PATENT DOCUMENTS

| | | | |
|---|---|---|---|
| DE | 102021108156 | A1 | 7/2022 |
| KR | 20200000785 | A | 1/2020 |
| KR | 20220106653 | A | 7/2022 |
| KR | 20220133068 | A | 10/2022 |
| TW | 202129871 | A | 8/2021 |
| TW | 202141477 | A | 11/2021 |
| TW | 202209509 | A | 3/2022 |

* cited by examiner

STRESS BUFFER IN INTEGRATED CIRCUIT PACKAGE COMPRISING DIRECTLY BONDED INTEGRATED CIRCUIT DIES TO AN INTERPOSER

PRIORITY CLAIM AND CROSS-REFERENCE

This application claims the benefits of U.S. Provisional Application No. 63/506,619, filed on Jun. 7, 2023, which application is hereby incorporated herein by reference in its entirety.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional package that includes multiple chips. Other packages have also been developed to incorporate three-dimensional aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
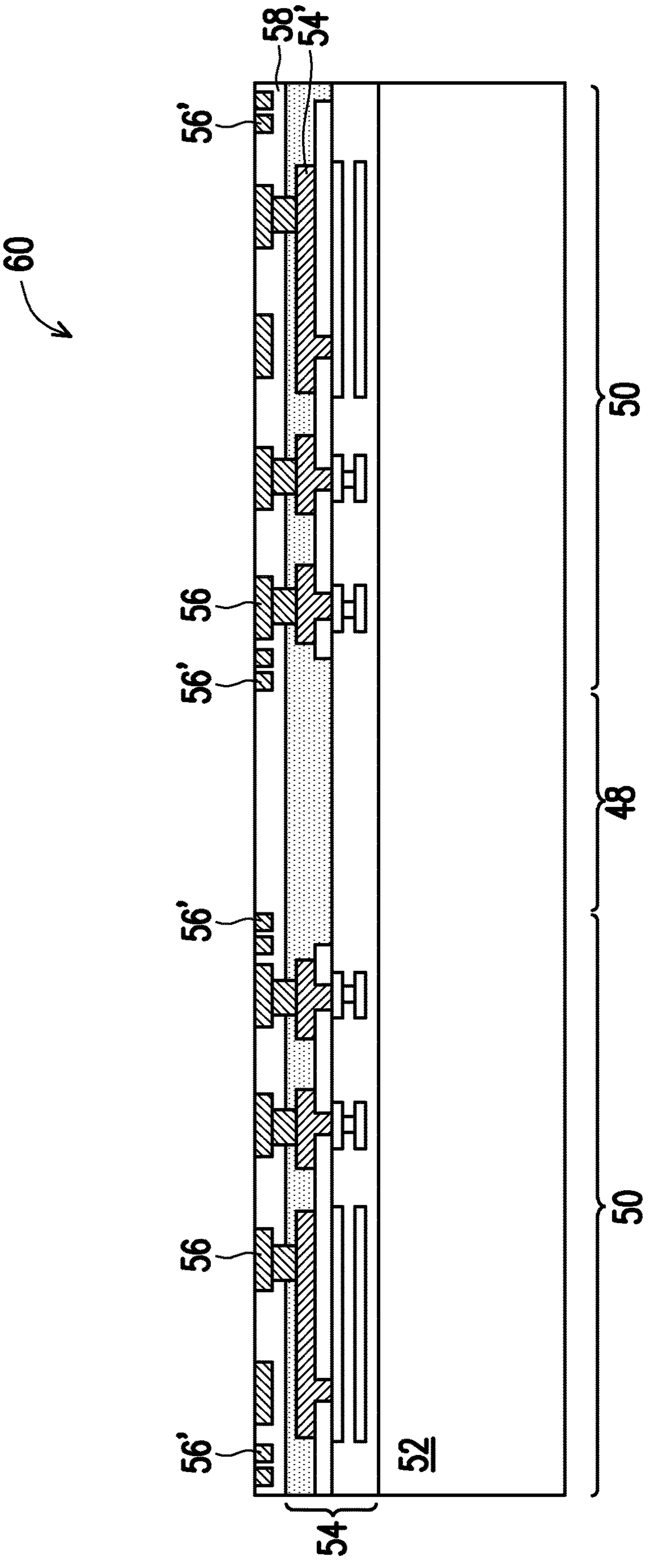
FIGS. 1, 2A, 2B, 3A, 3B, 4A, 4B, 4C, 5, 6A, 6B, 6C, 6D, 6E, 6F, 7, 8, 9, 10, and 11 illustrate varying views of various intermediate stages of manufacturing a semiconductor package according to various embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, integrated circuit packages are formed by directly bonding integrated circuit dies to a wafer that contains another device, such as an interposer, and a molding compound is dispensed around the integrated circuit dies as an encapsulant. Stress relief features are formed in the integrated circuit dies prior to bonding, for example, during an integrated circuit die dicing process. The stress relief features may include relatively shallow recesses (or ledges) that are formed in at least an insulating bonding layer of the integrated circuit dies by, for example, plasma dicing. The relatively shallow recesses provide artificial delamination surfaces in the integrated circuit dies, which can be adhered to the underlying interposer by the molding compound. As a result, bonding interface stress can be reduced, and adhesion is improved.

Further, corners of the insulating bonding layer may have a chamfer shape in a top-down view. For example, the corners of the insulating bonding layer may be notched a result of the dicing process to form the relatively shallow recess, and the corners of the insulating bonding layer may be free of any right angles, which further reduces stress in the bonded package. It has been observed that embodiment packages including such shallow recesses can result in up to 50% stress reduction at low temperature conditions and up to 90% stress reduction at high temperature conditions. Accordingly, various embodiments provide semiconductor packages with reduced stress and improved bonding integrity.

FIG. 1 is a cross-sectional view of a wafer 60, which includes integrated circuit dies 50. The integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die). The integrated circuit dies 50 may be formed in the wafer 60, which may include different device regions that are singulated in subsequent steps to form a plurality of integrated circuit dies 50. Specifically, the device regions may be separated by scribe line regions 48 in which the subsequent singulation process is performed. The integrated circuit dies 50 each include a semiconductor substrate 52, an interconnect structure 54, and bond pads 56 disposed in an insulating bonding layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form one or more integrated circuits. The interconnect structure 54 may include one or more dielectric layer(s) and respective metallization pattern(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization patterns may include conductive vias and/or conductive lines to interconnect the devices of the semiconductor substrate 52. The metallization patterns may be formed of a conductive material, such as a metal, such as copper, cobalt, aluminum, gold, combinations thereof, or the like. The interconnect structure 54 may be formed by a damascene process, such as a single damascene process, a dual damascene process, or the like. The interconnect structure 54 may further include metal pads 54', which are connected to a top-most metallization pattern of the interconnect structure 54 through one or more passivation layers. An additional insulating layer may be formed around the metal pads 54' to provide a planar surface on which to form the overlaying insulating bonding layer 58.

Bond pads 56 are at the front side 50F of the integrated circuit die 50. The bond pads 56 may be conductive pillars, pads, or the like, to which external connections are made. The bond pads 56 can be formed of a metal, such as copper, aluminum, or the like, and can be formed by, for example, plating, or the like. In some embodiments, the bond pads 56 may be electrically connected to conductive features of the interconnect structure 54 (e.g., the metal pads 54') by conductive vias (sometimes referred to as bond pad vias). The bond pads 56 further includes one or more bond pad seal rings 56' at peripheries of the integrated circuit dies 50. Each of the bond pad seal rings 56' may be disposed in a loop (see e.g., FIG. 4C) that encircles remaining respective bond pads 56 of each of the integrated circuit dies 50. Although not explicitly illustrated, the bond pad seal rings 56' may extend into and/or through the interconnect structure 54 to encircle the metallization patterns of the interconnect structure 54 of each integrated circuit die 50 in a top-down view.

The bond pads 56 may be disposed in an insulating bonding layer 58 at the front side 50F of the integrated circuit die 50. The insulating bonding layer 58 may be made of a material suitable for subsequent dielectric-to-dielectric bonding, such as, silicon oxide, silicon oxynitride, or the like. The insulating bonding layer 58 may be deposited on the interconnect structure, for example, by spin coating, lamination, chemical vapor deposition (CVD), or the like. The bond pads 56 may be formed in the insulating bonding layer with a damascene process for example, and a planarization process (e.g., a chemical mechanical polish (CMP) or the like) may be performed such that top surfaces of the bond pads 56 and the insulating bonding layer 58 are coplanar (within process variations) and are exposed at the front side 50F of the integrated circuit die 50. As will be described in greater detail below, the planarized front side 50F of the integrated circuit die 50 will be directly bonded to another device, such as an interposer.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias or through-silicon vias (TSVs). Each of the semiconductor substrates 52 may (or may not) have a separate interconnect structure 54.

Figure 2A:
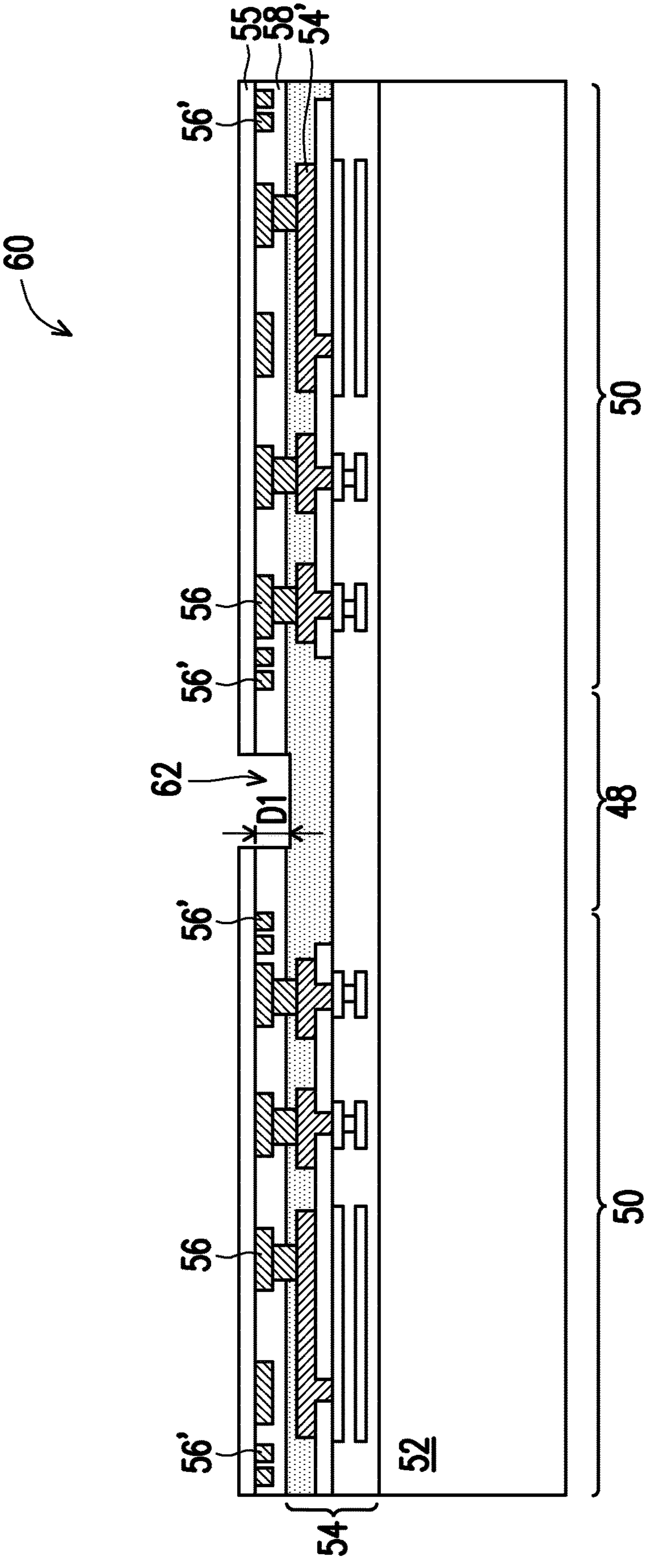

FIGS. 2A through 4C are varying views of intermediate steps during a singulation process to separate the integrated circuit dies 50 from the wafer 60. Starting with FIGS. 2A and 2B, a relatively shallow recess 62 is formed in the insulating bonding layer 58 in the scribe line region 48 between adjacent integrated circuit dies 50. FIG. 2A illustrates a cross-sectional view, and FIG. 2B illustrates a detailed, top-down view of boundaries of four, adjacent integrated circuit dies 50 in the scribe line region 48.

In some embodiments, the shallow recess 62 is formed with a plasma dicing process in the scribe line regions 48. The plasma dicing process may include forming a patterned mask 55, which may be a photomask patterned by lithography, or the like. The plasma dicing process etches portions of the insulating bonding layer 58 exposed by the patterns (e.g., openings) in the patterned mask 55. As illustrated in FIG. 2A, the shallow recess 62 extends into the insulating bonding layer 58. In some embodiments, the shallow recess 62 extends through the insulating bonding layer 58 and may further extend into dielectric layers of interconnect structure 54. However, the shallow recess 62 does not extend into the semiconductor substrate 52 because the recess 62 is relatively shallow. For example, a bottom surface of the recess 62 may be above a top surface of the semiconductor substrate 52. In some embodiments, a depth D1 that the recess 62 extends may be in a range of 5 kÅ to 2.5 μm. Because the relatively shallow recess 62 does not extend into the semiconductor substrate 52, the integrated circuit dies 50 can be readily adhered to an underlying component (e.g., an interposer) by an encapsulant as will be explained subsequently.

In some embodiments, the plasma dicing is a dry plasma process such as Reactive Ion Etching (RIE) using a fluorine-based plasma, an argon-based plasma, an oxygen-based plasma, a nitrogen-based plasma, or the like. Plasma dicing advantageously allows for non-rectangular shapes to be formed in the integrated circuit dies 50.

Figure 2B:
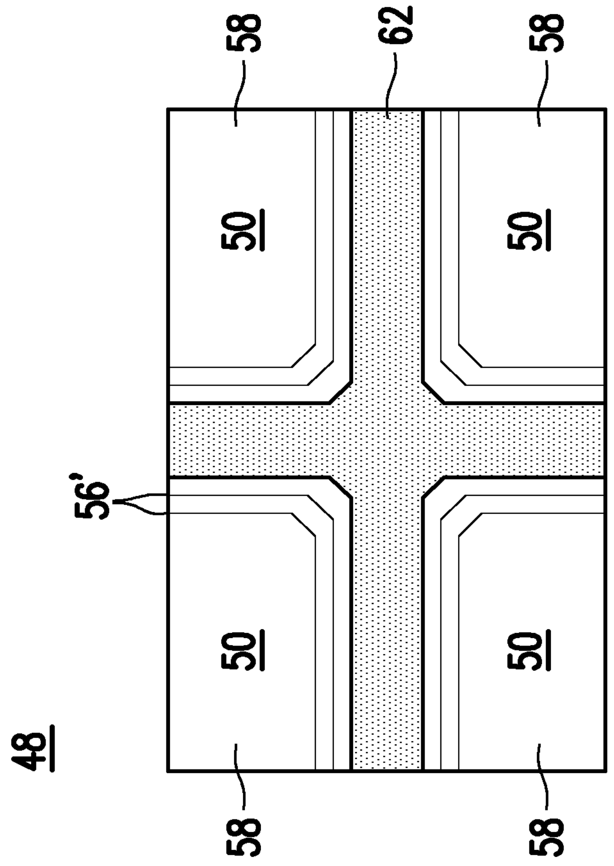

As illustrated by FIG. 2B, the formation of the recess 62 defines chamfer-shaped corners in the insulating bonding layer 58. For example, in a top-down view, corners of the insulating bonding layer 58 in the recess 62 may be notched to be relatively blunt and is not disposed at a right angle. It has been observed that the chamfer-shaped corners of the insulating bonding layer 58 advantageously reduces stress in the subsequently bonded package. For example, chamfer-shaped corners may reduce the number of stress concentration zones at sharply angled corners, which advantageously reduces the risk of delamination of bonding layers in the bonded structure. Because the recess 62 does not extend into the semiconductor substrate 52, the chamfer-shape of the recess 62 likewise does not extend into the semiconductor substrate 52.

Figure 3A:
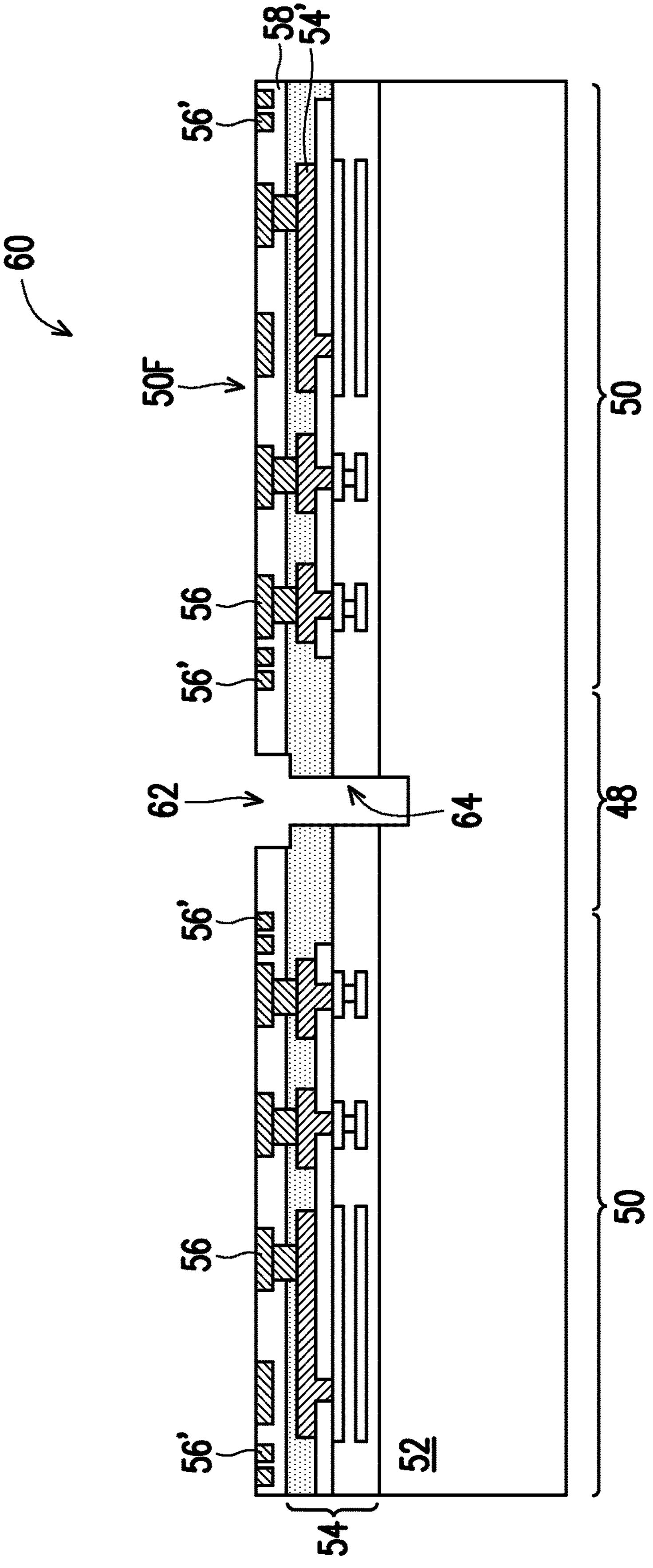
Figure 3B:
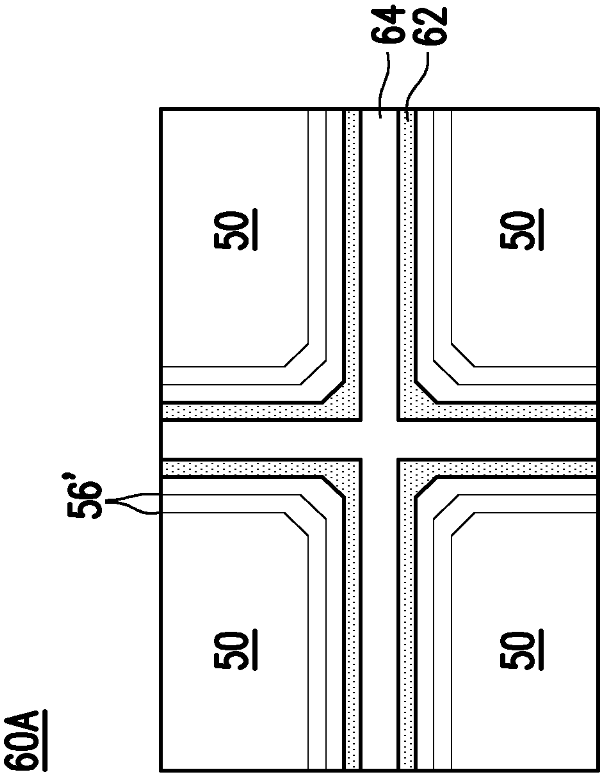

In FIGS. 3A and 3B, an optional grooving process is performed to define a groove 64 in the scribe line region 48 between adjacent integrated circuit dies 50. The grooving process may be performed through the recess 62, so that the groove 64 is connected to the recess 62. FIG. 3A illustrates a cross-sectional view, and FIG. 3B illustrates a detailed, top-down view of boundaries of four, adjacent integrated circuit dies 50 in the scribe line region 48. As illustrated by FIG. 3A, the groove 64 may extend from the recess 62 into the semiconductor substrate 52. In some embodiments, the grooving process may be a laser grooving process, another plasma dicing process (e.g., a deep plasma dicing process), or the like. The groove 64 may be less narrow than the recess 62.

Figure 4A:
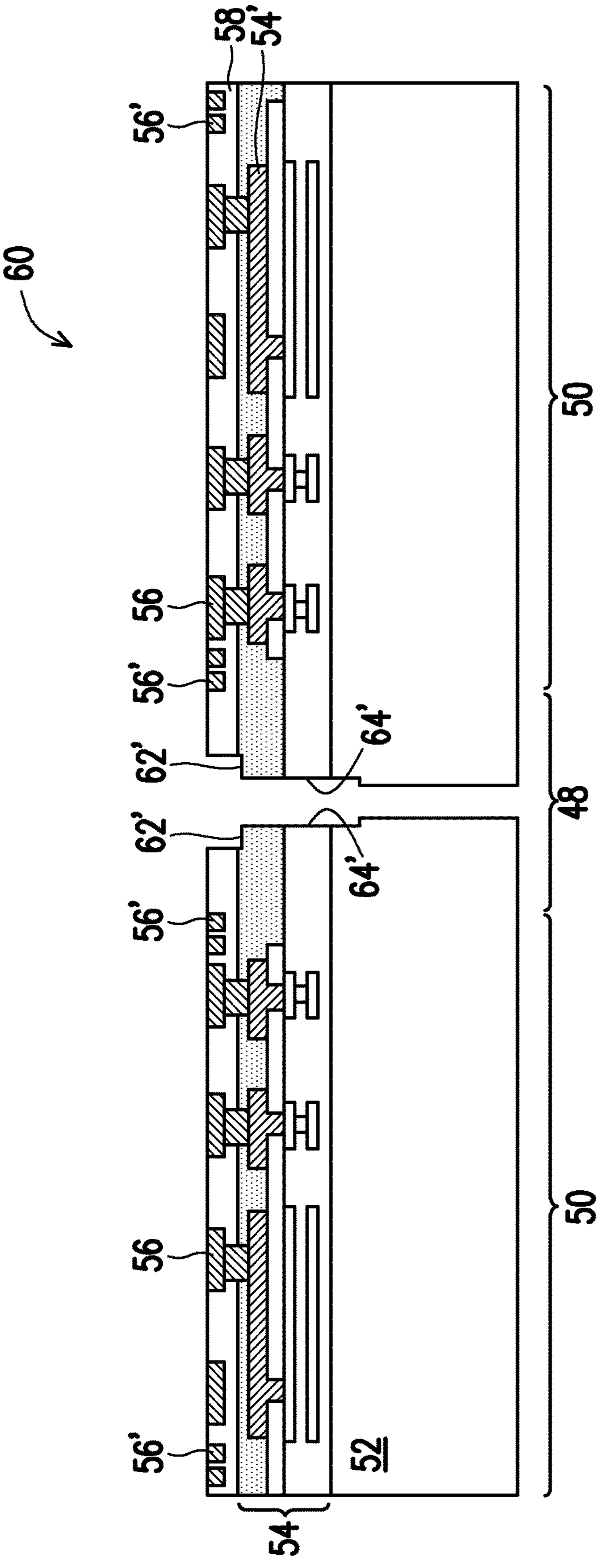
Figure 4C:
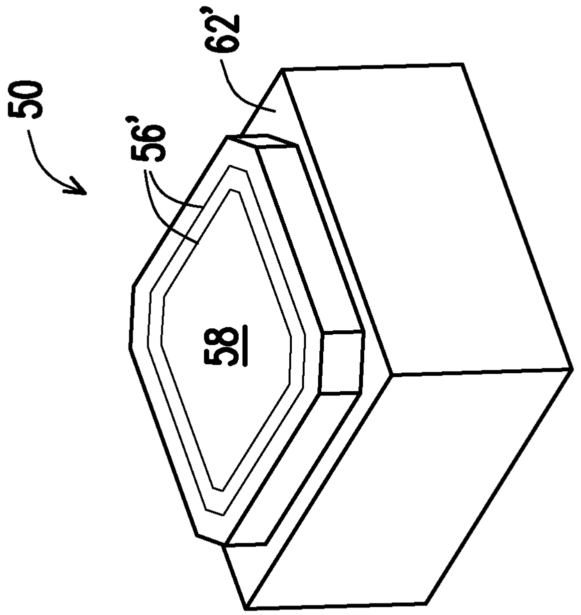
Figure 4B:
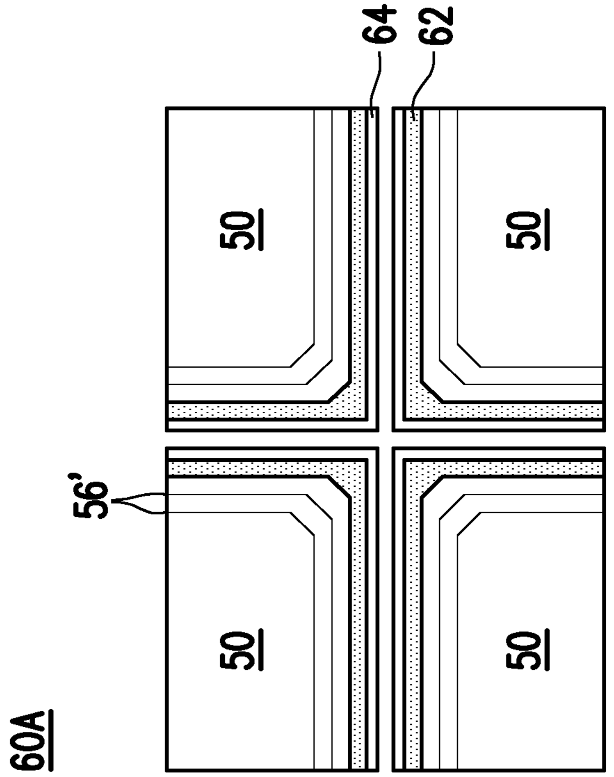

In FIG. 4A through 4C, a sawing process is performed to fully separate the integrated circuit dies 50 from each other and the wafer 60. The sawing process may be performed through the recess 62 and the groove 64 (if present) in the scribe line region 48. FIG. 4A illustrates a cross-sectional view; FIG. 4B illustrates a detailed, top-down view of boundaries of four, adjacent integrated circuit dies 50 in the scribe line region 48; and FIG. 4C illustrates a simplified, perspective view of a singulated, integrated circuit die 50. In some embodiments, the sawing process is a mechanical process using a saw blade that is placed in the recess 62 and the groove 64 to saw through the remaining semiconductor substrate 52. Other sawing processes may be used in other embodiments.

After the sawing process, each singulated, integrated circuit die 50 includes a ledge 62' (corresponding to a location of the recess 62) and an optional ledge 64' (corresponding to a location of the groove 64). Due to differences in the plasma dicing process and the sawing process, surfaces of different regions of the integrated circuit die 50 may have different roughnesses. For example, surfaces of the ledge 62' (sidewalls of the insulating bonding layer 58), which are formed by plasma dicing, may be smoother than sidewalls of the semiconductor substrate 52, which are formed by mechanical sawing. The ledge 62' provides an artificially delaminated surface, which can be adhered to an underlying package component by a subsequently formed molding compound (see FIGS. 6A through 6F) to advantageously reduce delamination defects in the bonded structure. Adhesion can be further improved due to the relatively shallow depth of the ledge 62' (e.g., in a range of 5 kÅ to 5 μm). Further, as illustrated in FIGS. 4B and 4C and described above, the ledge 62' may have a chamfer-shaped corner in a top-down view, which advantageously reduces stress accumulation at corners of the integrated circuit dies 50 and further reduces delamination defects in the resulting package. The chamfer-shaped corner may be localized to the ledge 62' and may not extend into remaining areas of the integrated circuit die as shown in FIG. 4C. For example, the semiconductor substrate 52 may have substantially (within process variation) right-angled corners. The chamfer-shaped corners of ledge 62'/the insulating bonding layer 58 may be laterally displaced from an outer sidewall of the semiconductor substrate 52.

FIGS. 5 through 11 are cross-sectional views of intermediate steps during a process for forming integrated circuit packages, in accordance with some embodiments. Details of the integrated circuit dies 50 may be simplified in FIGS. 5 through 11 for ease of illustration. FIGS. 5 through 10 illustrate a particular package configuration, but it should be appreciated that other package configurations may be used as well.

Figure 10:
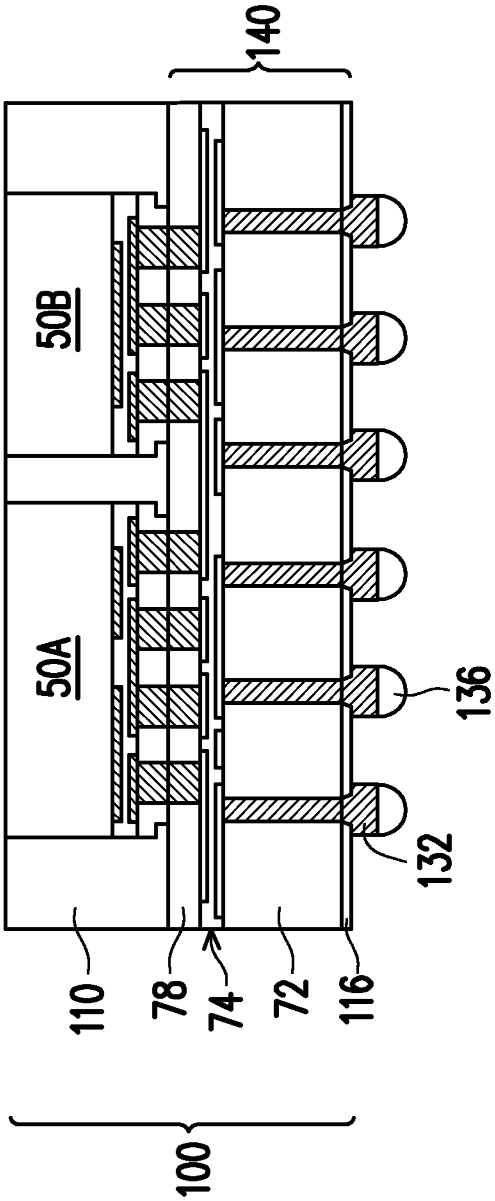
Figure 11:
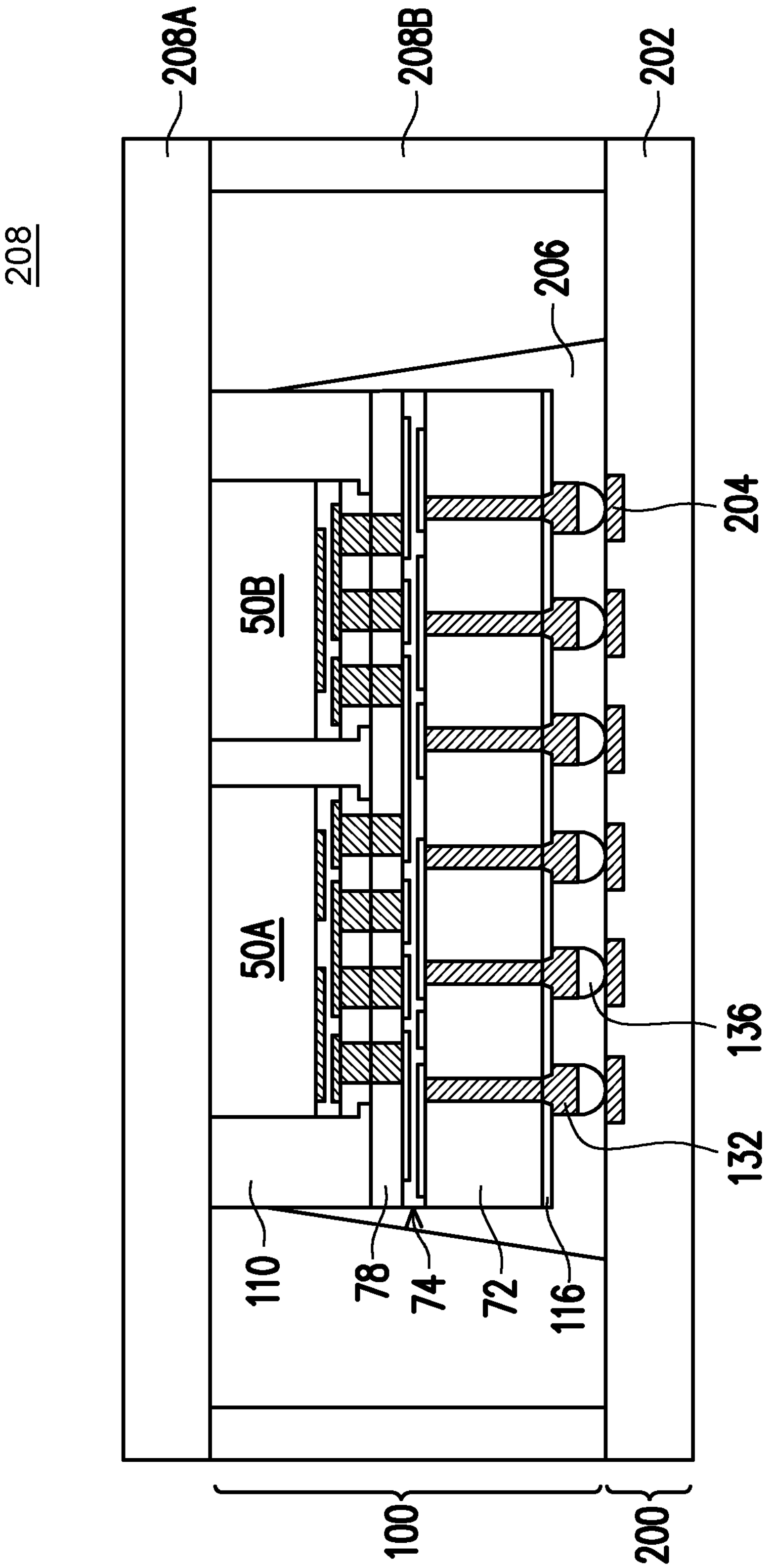

In FIGS. 5 through 9, integrated circuit packages 100 are formed by bonding integrated circuit dies 50 to a wafer 70. The wafer 70 has package regions 100A, 100B, which each include devices formed therein, such as interposers. In FIG. 10, the package regions 100A, 100B are singulated to form integrated circuit packages 100 that each include a singulated portion of the wafer 70 (e.g., an interposer 140) and the integrated circuit dies 50 that are bonded to the singulated portion of the wafer 70. In FIG. 11, the integrated circuit packages 100 are then mounted to a package substrate 200.

Figure 5:
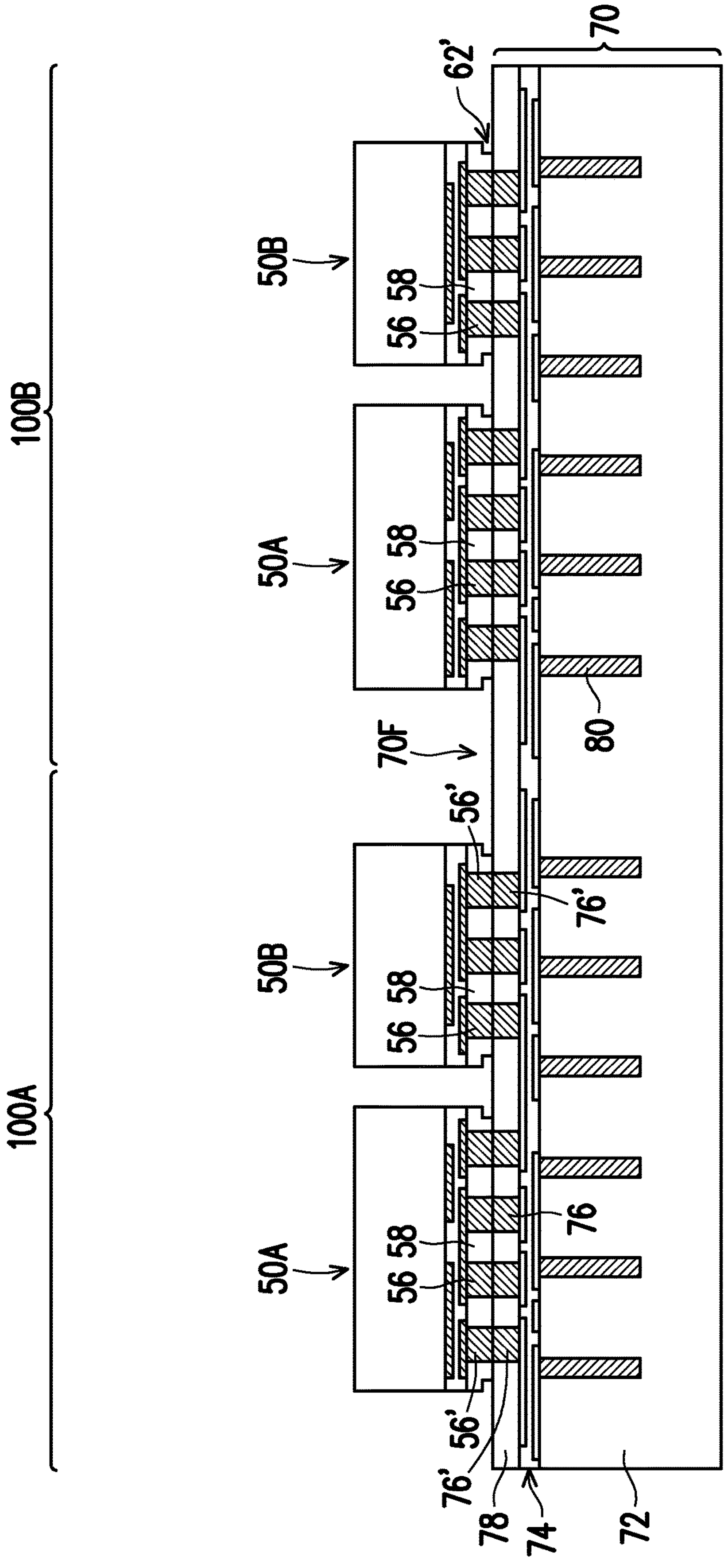

Referring first to FIG. 5, a wafer 70 is illustrated. The wafer 70 comprises devices in the package regions 100A, 100B, which will be singulated in subsequent processing to be included in the integrated circuit packages 100. The devices formed in the wafer 70 may be interposers, integrated circuits dies, or the like. The wafer 70 includes a substrate 72, an interconnect structure 74, bond pads 76, a insulating bonding layer 78, and conductive vias 80.

The substrate 72 may be a bulk semiconductor substrate, a semiconductor-on-insulator (SOI) substrate, a multi-layered semiconductor substrate, or the like. The substrate 72 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 72 may be doped or undoped. In embodiments where passive interposers are formed in the wafer 70, the substrate 72 generally does not include active devices therein, although the passive interposers may include passive devices formed in and/or on a front surface (e.g., the surface facing upward) of the substrate 72. In embodiments where active interposers (also referred to as integrated circuits dies) are formed in the wafer 70, active devices such as transistors, capacitors, resistors, diodes, and the like, may be formed in and/or on the front surface of the substrate 72.

The interconnect structure 74 is over the front surface of the substrate 72, and is used to electrically connect the devices (if any) of the substrate 72. The interconnect structure 74 may include one or more dielectric layer(s) and respective metallization pattern(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization patterns may include conductive vias and/or conductive lines to interconnect any devices together and/or to an external device. The metallization patterns may be formed of a conductive material, such as a metal, such as copper, cobalt, aluminum, gold, combinations thereof, or the like. The interconnect structure 74 may be formed by a damascene process, such as a single damascene process, a dual damascene process, or the like.

Bond pads 76 are at the front side 70F of the wafer 70. The bond pads 76 may be conductive pillars, pads, or the like, to which external connections are made. The bond pads 76 can be formed of a metal, such as copper, aluminum, or the like, and can be formed by, for example, plating, or the like. In some embodiments, the bond pads 76 may be electrically connected to conductive features of the interconnect structure 74 by conductive vias (sometimes referred to as bond pad vias, not explicitly illustrated). The bond pads 76 further includes one or more bond pad seal rings 76' at peripheries of each package region 100A, 100B. Each of the bond pad seal rings 76' may be disposed in a loop that encircles remaining respective bond pads 76 of each of package regions 100A, 100B. In some embodiments, the bond pad seal rings 76' of the wafer 70 may have a different footprint (e.g., larger) than a footprint of the bond pad seal rings 56' of the integrated circuit dies 50. Although not explicitly illustrated, the bond pad seal rings 76' may extend into and/or through the interconnect structure 74 to encircle the metallization patterns of the interconnect structure 74 of each package region 100A, 100B in a top-down view.

The bond pads 76 may be disposed in an insulating bonding layer 78 at the front side 70F of the wafer 70. The insulating bonding layer 78 may be made of a material suitable for subsequent dielectric-to-dielectric bonding, such as, silicon oxide, silicon oxynitride, or the like. The insulating bonding layer 78 may be deposited on the interconnect structure, for example, by spin coating, lamination, chemical vapor deposition (CVD), or the like. A material of the insulating bonding layer 78 may be the same or different as the insulating bonding layer 58. For example, in a particular embodiment, one of the insulating bonding layers 58/78 is made of silicon oxide and another one of the insulating bonding layers 58/78 is made of silicon oxynitride. Other combinations are also possible. The bond pads 76 may be formed in the insulating bonding layer 78 with a damascene process for example, and a planarization process (e.g., a chemical mechanical polish (CMP) or the like) may be performed such that top surfaces of the bond pads 76 and the insulating bonding layer 78 are coplanar (within process variations) and are exposed at the front side 70F of the wafer 70.

The conductive vias 80 extend into the substrate 72 and/or the interconnect structure 74. The conductive vias 80 are electrically coupled to metallization patterns of the interconnect structure 74. The conductive vias 80 are also sometimes referred to as TSVs. As an example to form the conductive vias 80, recesses can be formed in the interconnect structure 74 and/or the substrate 72 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 74 or the substrate 72 by, for example, a CMP. Remaining portions of the barrier layer and conductive material form the conductive vias 80.

Integrated circuit dies 50 are bonded to the wafer 70. In this embodiment, the integrated circuit dies 50 include multiple integrated circuit dies 50A, 50B that are placed in each of the package regions 100A, 100B. The integrated circuit dies 50A, 50B may each have a single function (e.g., a logic device, memory device, etc.), or may have multiple functions (e.g., a SoC). Although two integrated circuit dies 50 are illustrated in each package region 100A, 100B, any number of integrated circuit dies 50 may be bonded in each package region 100A, 100B. In another embodiment, a single integrated circuit die 50 is bonded in each of the package regions 100A, 100B. The integrated circuit dies 50 in each package region 100A, 100B may be a same size (have a same footprint and height) or they may be different sizes (having a different footprint and/or height).

The integrated circuit dies 50 and the wafer 70 are directly bonded in a face-to-face manner by a dielectric-to-dielectric bonding and metal-to-metal bonding process (sometimes referred to as hybrid bonding), such that the front sides 50F of the integrated circuit dies 50 are bonded to the front side 70F of the wafer 70. Specifically, the insulating bonding layers 58 of the integrated circuit dies 50 are bonded to the insulating bonding layer 78 of the wafer 70 through dielectric-to-dielectric bonding, without using any adhesive material (e.g., die attach film), and the bond pads 56 of the integrated circuit dies 50 are bonded to the bond pads 76 of the wafer 70 through metal-to-metal bonding, without using any eutectic material (e.g., solder). The bonding may include a pre-bonding and an annealing. During the pre-bonding, a small pressing force is applied to press the integrated circuit dies 50 against the wafer 70. The pre-bonding is performed at a low temperature, such as room temperature, such as a temperature in the range of about 15° C. to about 30° C. The bonding strength of the insulating bonding layers 58, 78 is then improved in a subsequent annealing step, in which the insulating bonding layers 58, 78 are annealed at a high temperature, such as a temperature in the range of about 100° C. to about 450° C. After the annealing, bonds, such as covalent bonds, are formed bonding the insulating bonding layers 58, 78. The bond pads 56, 76 are connected to each other with a one-to-one correspondence. The bond pads 56, 76 may be in physical contact after the pre-bonding, or may expand to be brought into physical contact during the annealing. Further, during the annealing, the material of the bond pads 56, 76 (e.g., copper) intermingles, so that metal-to-metal bonds are also formed. Hence, the resulting bonds between the integrated circuit dies 50 and wafer 70 are hybrid bonds that include both dielectric-to-dielectric bonds and metal-to-metal bonds.

Because the integrated circuit dies 50 include ledges 62', gaps may be disposed in peripheral regions of the integrated circuit dies 50 between the insulating bonding layers 58, 78. For example, sidewalls of the insulating bonding layer 58 (including the chamfer-shaped corners of the insulating bonding layer 58) may be laterally displaced from an outer sidewall of semiconductor substrate 52, which results in gaps in the bonded structure. The insulating bonding layers 58, 78 may remain not touching and not bonded at peripheries of the integrated circuit dies 50. These gaps allow for a subsequently formed encapsulant to be filled between the insulating bonding layers 58, 78 to improve adhesion, reduce stress, and reduce delamination defects.

In FIGS. 6A through 6F, an encapsulant 110 is formed on the various components. The encapsulant 110 is formed of a molding material or compound. The molding material includes a polymer material and optionally includes fillers (e.g., fillers 110', see FIGS. 6B through 6D). The polymer material may be an epoxy or the like. The fillers are formed of a material that provides mechanical strength and thermal dispersion for the encapsulant 110, such as particles of silica ($SiO_2$). The molding material (including the polymer material and/or the fillers) may be formed by compression molding, transfer molding, or the like. The encapsulant 110 may be formed over the front side 70F of the wafer 70 such that the integrated circuit dies 50 are buried or covered. The encapsulant 110 is then cured. A planarization process may be performed to planarize the top surface of the encapsulant 110 and the integrated circuit dies 50. The planarization process may be a CMP, an etch-back, combinations thereof, or the like. In the illustrated embodiment, the integrated circuit dies 50 are exposed by the planarization of the encapsulant 110 such that top surfaces of the integrated circuit dies 50 and the encapsulant 110 are substantially level (within process variations) after planarization. The planarization may remove portions of the semiconductor substrate 52. In some embodiments, the integrated circuit dies 50 may have a thickness T1 that is in a range of 250 μm to 650 μm. Other thicknesses are also possible.

Figure 6A:
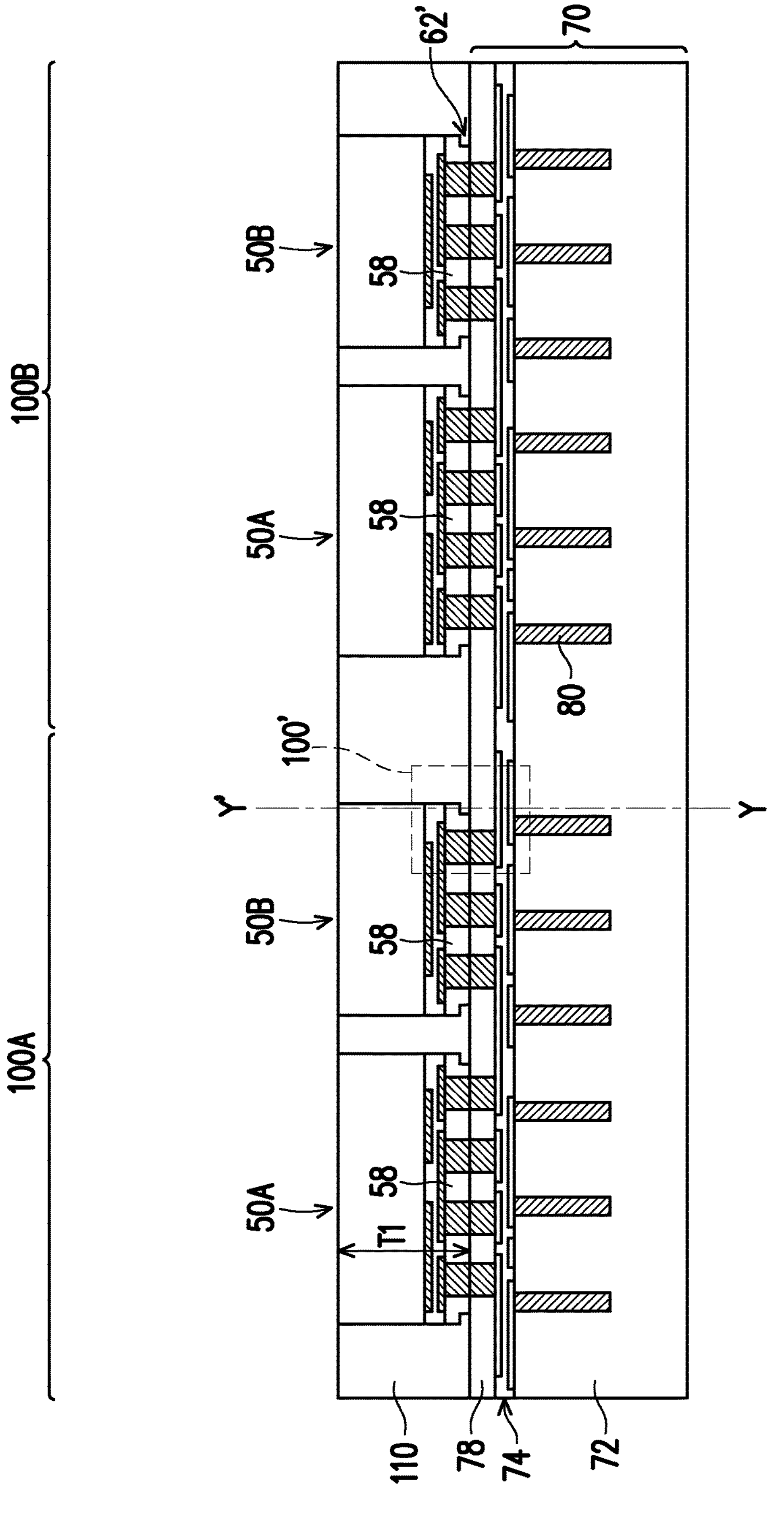
Figure 6B:
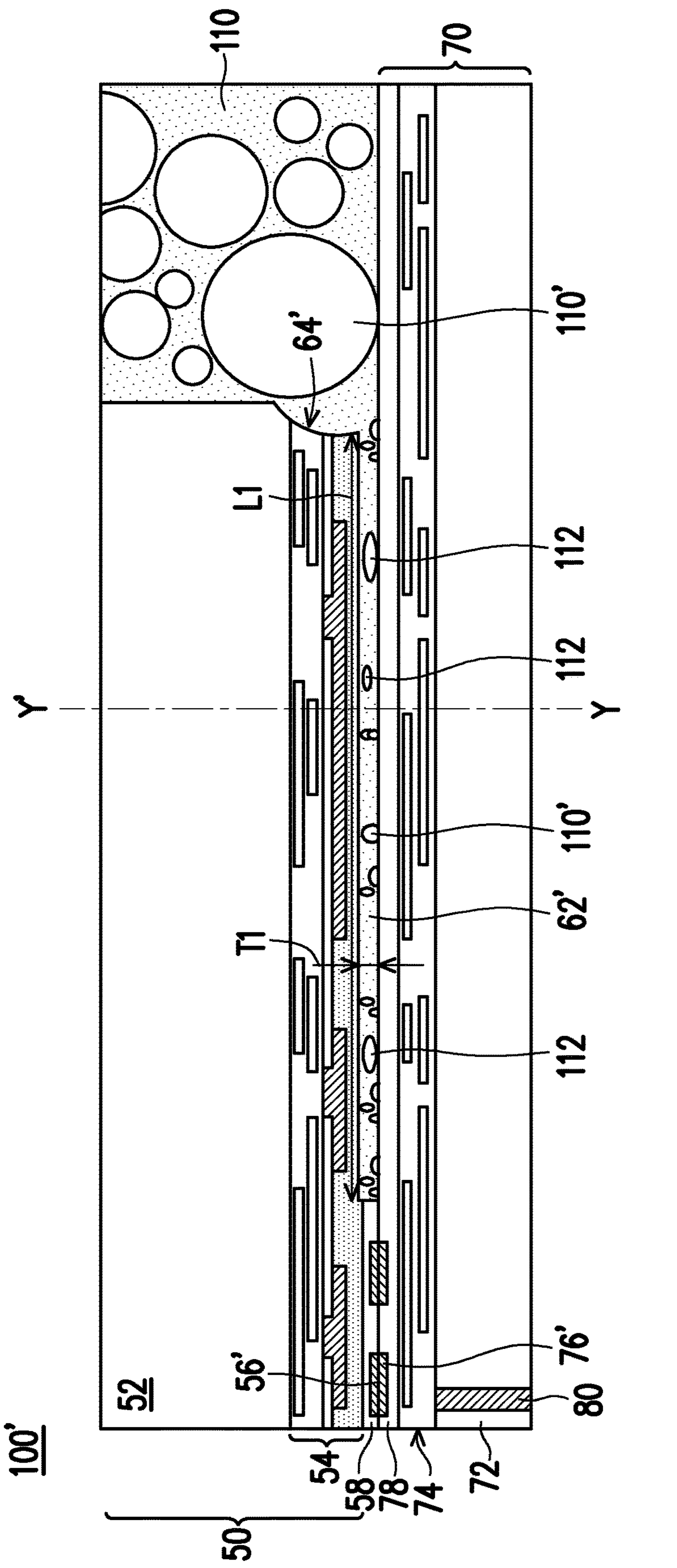
Figure 6C:
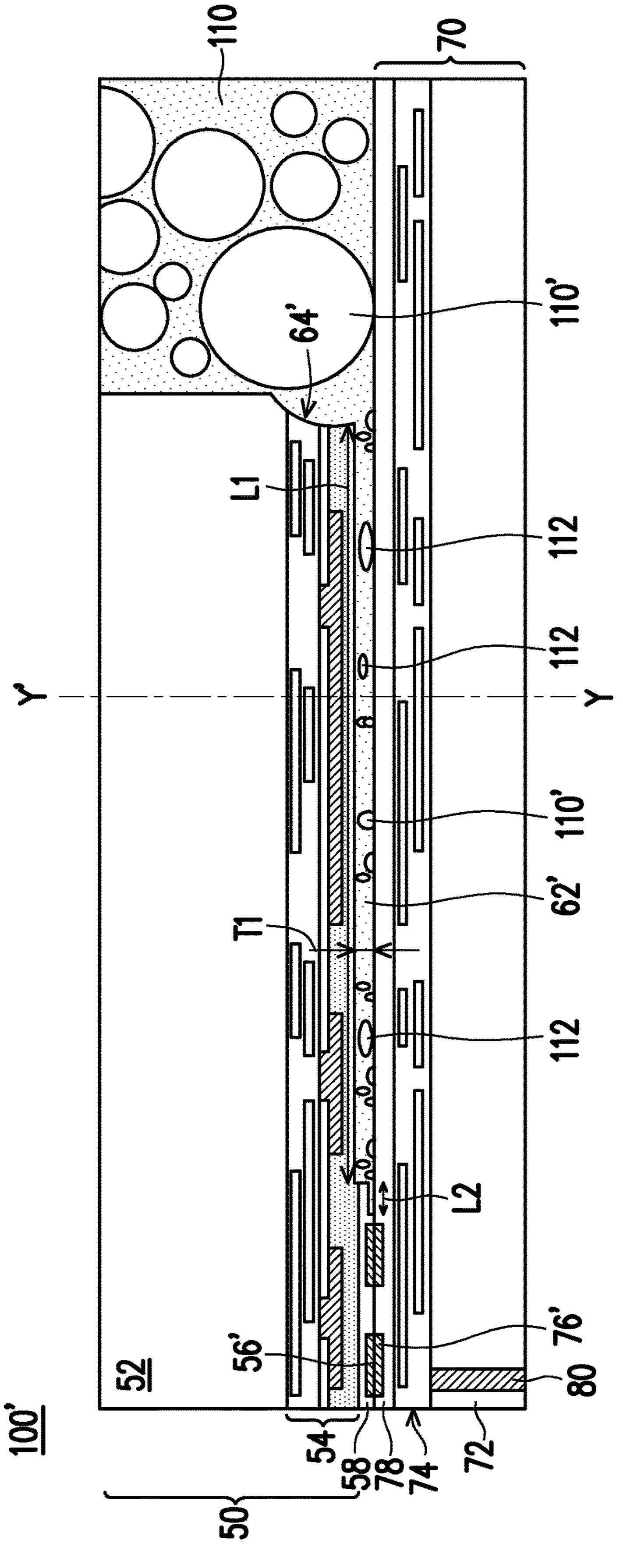
Figure 6D:
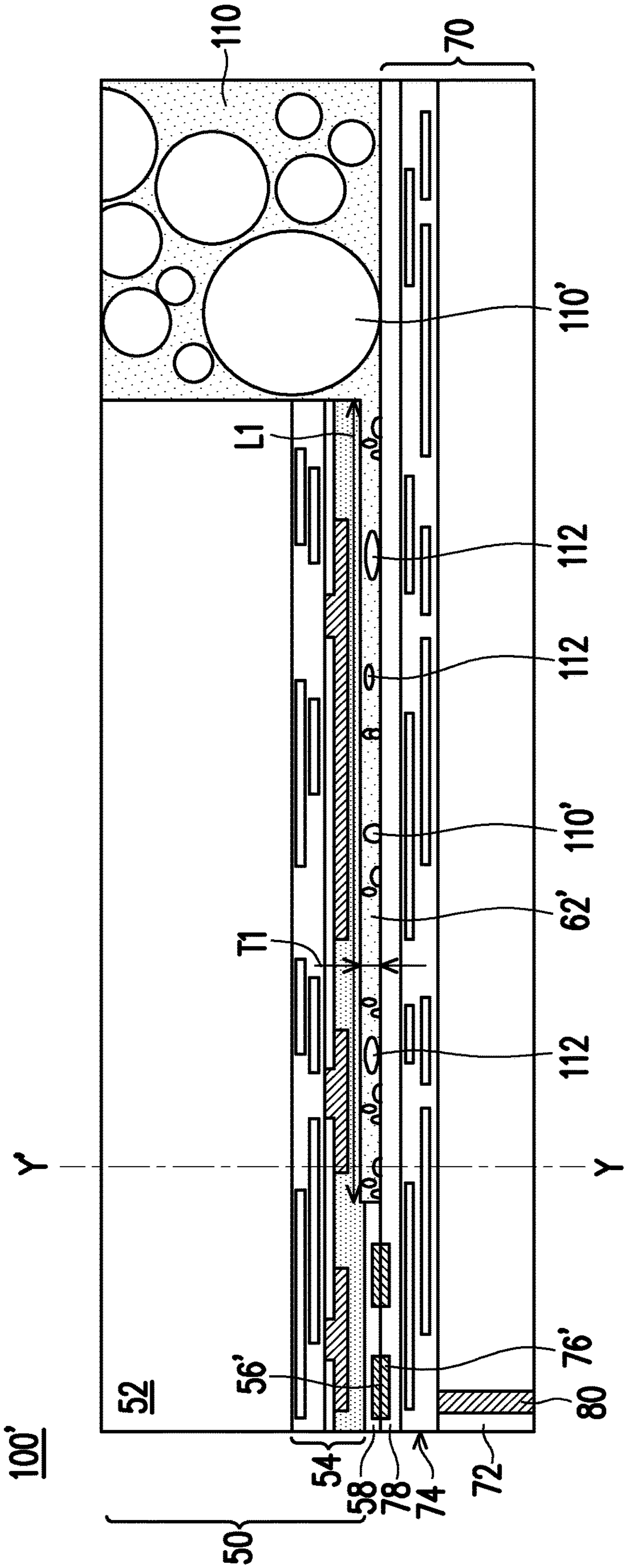

The encapsulant 110 surrounds and protects the integrated circuit dies 50. The encapsulant 110 may further extend into gaps provided by the ledges 62' of the integrated circuit dies 50, between the insulating bonding layers 58, 78. For example, the encapsulant 110 may be disposed between the insulating bonding layers 58, 78 along a line Y-Y' that is perpendicular to a major surface of the semiconductor substrates 52, 72. In this manner, the encapsulant 110 may be used as an adhesive to improve adhesion between the insulating bonding layers 58, 78 and reduce delamination defects. For example, the ledges 62' provide a virtual delamination surface that has been adhered to the insulating bonding layers 78. FIGS. 6B through 6D illustrate detailed, cross-sectional views of region 100' of FIG. 6A according to various embodiments. In each of the embodiments of FIGS. 6B through 6D, the encapsulant 110 extends between the insulating bonding layers 58, 78 in the ledge 62'. The encapsulant 110 may extend laterally from a sidewall of the insulating bonding layer 58 (including the chamfer-shaped corners of the insulating bonding layer 58) to an outer sidewall of the semiconductor substrate 52. In some embodiments, the fillers 110' of the encapsulant 110 may be also be disposed between the insulating bonding layers 58, 78 along the line Y-Y'. Further, because of the relatively small size of the ledges 62', voids 112 (e.g., internal seams and/or air gaps) may be formed in the encapsulant 110 between the insulating bonding layers 58, 78 along the line Y-Y' as part of the filling process to dispense the encapsulant 110 into the ledges 62'. In some embodiments, as illustrated by FIG. 6C, the encapsulant 110 may further extend partially into an interface between the insulating bonding layers 58, 78.

In some embodiments, as illustrated by FIGS. 6B and 6C, where the grooving process of FIGS. 3A and 3B is performed, the ledge 64' is included in the integrated circuit dies 50. In such embodiments, the interconnect structure 54 and a region of the semiconductor substrate 52 is laterally recessed and displaced from remaining portions of the semiconductor substrate 52. In other embodiments, where grooving process is not performed, the ledges 64' may be omitted and sidewalls of the interconnect structure 54 and the substrate 52 may be coterminous as illustrated by FIG. 6D.

Due to the plasma dicing process used to form surfaces of the ledges 62', surfaces of the ledges 62' may have a different roughness than other surfaces of the insulating bonding layer 58. For example, in some embodiments, an interface between the insulating bonding layer 58, 78 may be smoother with less height variation (e.g., be more planar) than an interface between the insulating bonding layer 58 and the encapsulant 110. In some embodiments, a height variation of the interface between the insulating bonding layers 58, 78 (e.g., differences in heights at different locations of the interface) may be less than 10 Å, and a height variation of the interface between the insulating bonding layer 58 and the encapsulant 110 at the ledges 62' may be in a range of 10 Å to 100 Å.

In various embodiments, dimensions of the encapsulant 110 between the insulating bonding layers 58, 78 correspond to dimensions of the ledge 62'. For example, a thickness T1 of the encapsulant 110 between the insulating bonding layers 58, 78 may be equal to the depth D1 of the recess 62/ledge 62' (see FIG. 2A), and the thickness T1 may be in a range of 5 kÅ to 2.5 μm. Further, in some embodiments (see FIGS. 6B and 6D), a length of the encapsulant 110 between the insulating bonding layers 58, 78 may be equal to a length L1 of the ledge 62', and the length L1 may be in a range of 1 μm to 150 μm. In some embodiments (see FIG. 6C), the encapsulant 110 may optionally extend beyond the ledge 62' and into an interface between the insulating bonding layers 58, 78. In such embodiments, a length L2 of the encapsulant 110 extending into the interface between the insulating bonding layers 58, 78 may be in a range of 0 μm to 10 μm. It has been observed that when the dimensions of the encapsulant 110 between the insulating bonding layers 58, 78 is in the above ranges, adhesion between the integrated circuit dies 50 and the wafer 70 can be improved and stress accumulation and delamination defects can be reduced. Accordingly, semiconductor packages with reduced defects, improved reliability, and improved yield can be achieved.

Figure 6E:
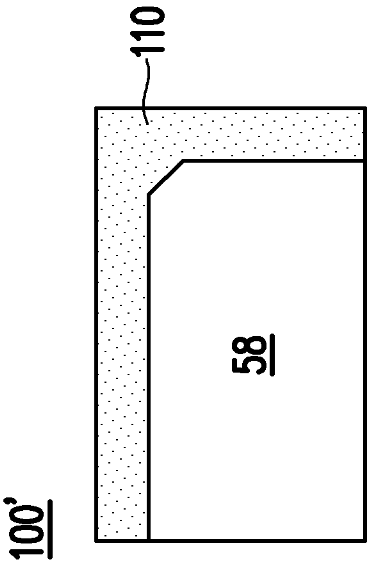
Figure 6F:
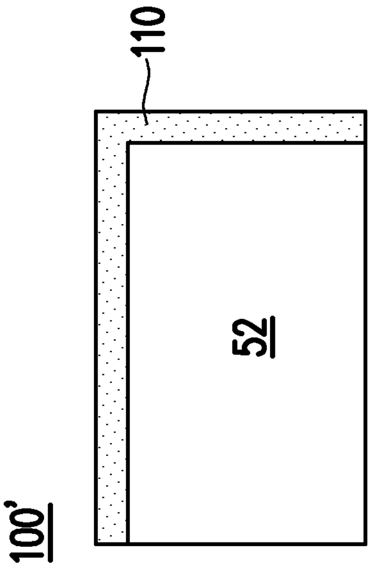

FIG. 6E illustrates a top-down view of the insulating bonding layer 58 of the integrated circuit die 50 and the encapsulant 110 in the region 100'; and FIG. 6F illustrates a top-down view of the semiconductor substrate 52 of the integrated circuit die 50 and the encapsulant 110 in the region 100'. The top-down views of FIGS. 6E and 6F may apply to any of the embodiments described above with respect to FIGS. 6B through 6D. As described above, corners of the insulating bonding layer 58 may have a chamfer shape. Likewise, the regions of the encapsulant 110 that abuts the corners of the insulating bonding layer 58 may also have the chamfer shape and not be disposed at a right angle. It has been observed that by employing chamfer-shaped corners, stress can be advantageously reduced in the bonded package. For example, experimental data combining chamfer-shaped corners and the artificial delamination surface (ledges 62') described above provided up to a 50% stress reduction and 90% stress reduction at low temperature and high temperature conditions, respectively. The chamfer-shaped corners may be limited to the insulating bonding layer 58 and portions of the interconnect structure 54. For example, the semiconductor substrate 52 may still include right-angle corners as illustrated by FIG. 6F.

Figure 7:
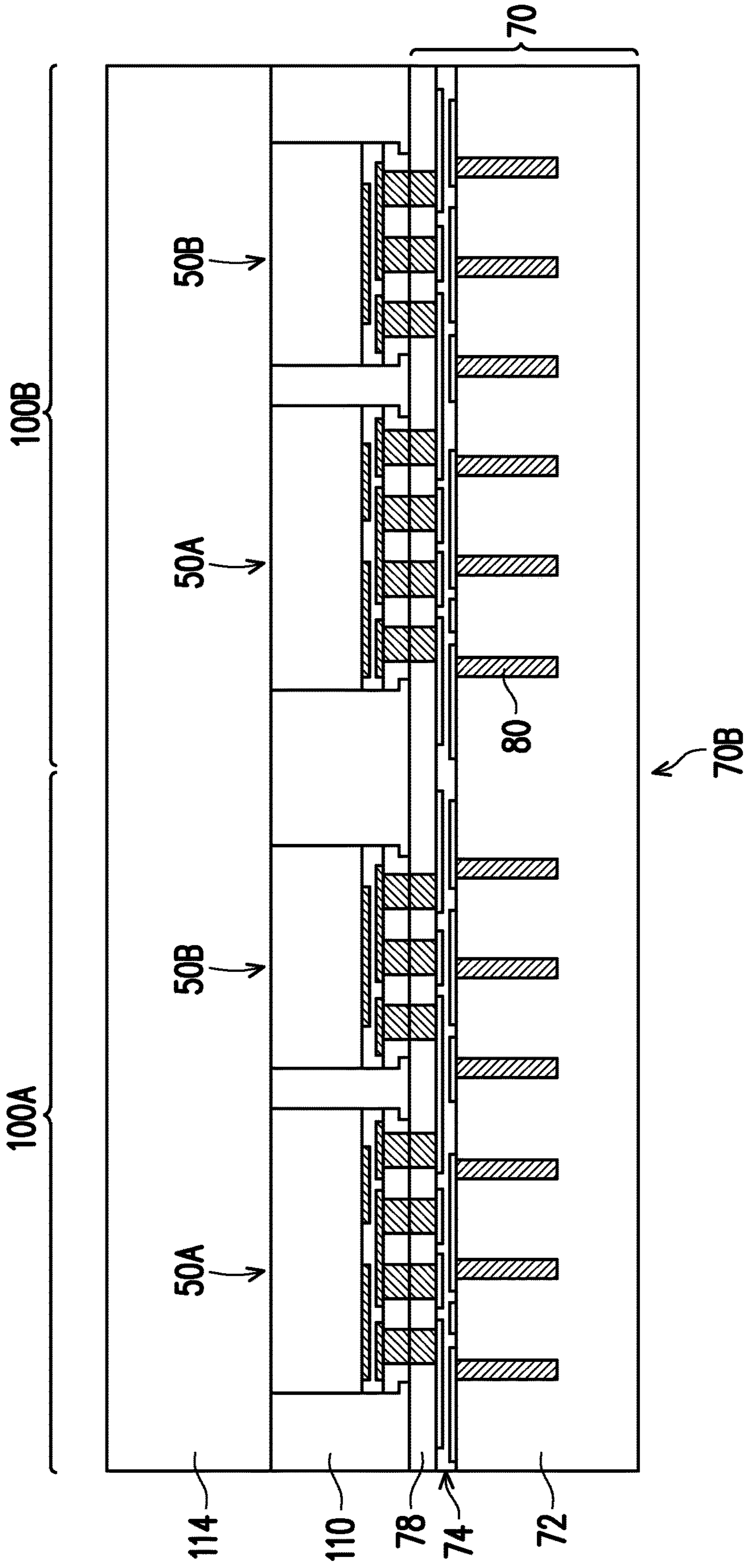

In FIG. 7, the intermediate structure is flipped over (not illustrated) to prepare for processing of the back side 70B of the substrate 72. The intermediate structure may be placed on a carrier substrate 114 or other suitable support structure for subsequent processing. For example, the carrier substrate 114 may be attached to the encapsulant 110 and the integrated circuit dies 50 by a release layer. The release layer may be formed of a polymer-based material, which may be removed along with the carrier substrate 114 from the structure after processing. In some embodiments, the carrier substrate 114 is a substrate such as a bulk semiconductor or a glass substrate. In some embodiments, the release layer is an epoxy-based thermal-release material, which loses its adhesive property when heated, such as a light-to-heat-conversion (LTHC) release coating.

Figure 8:
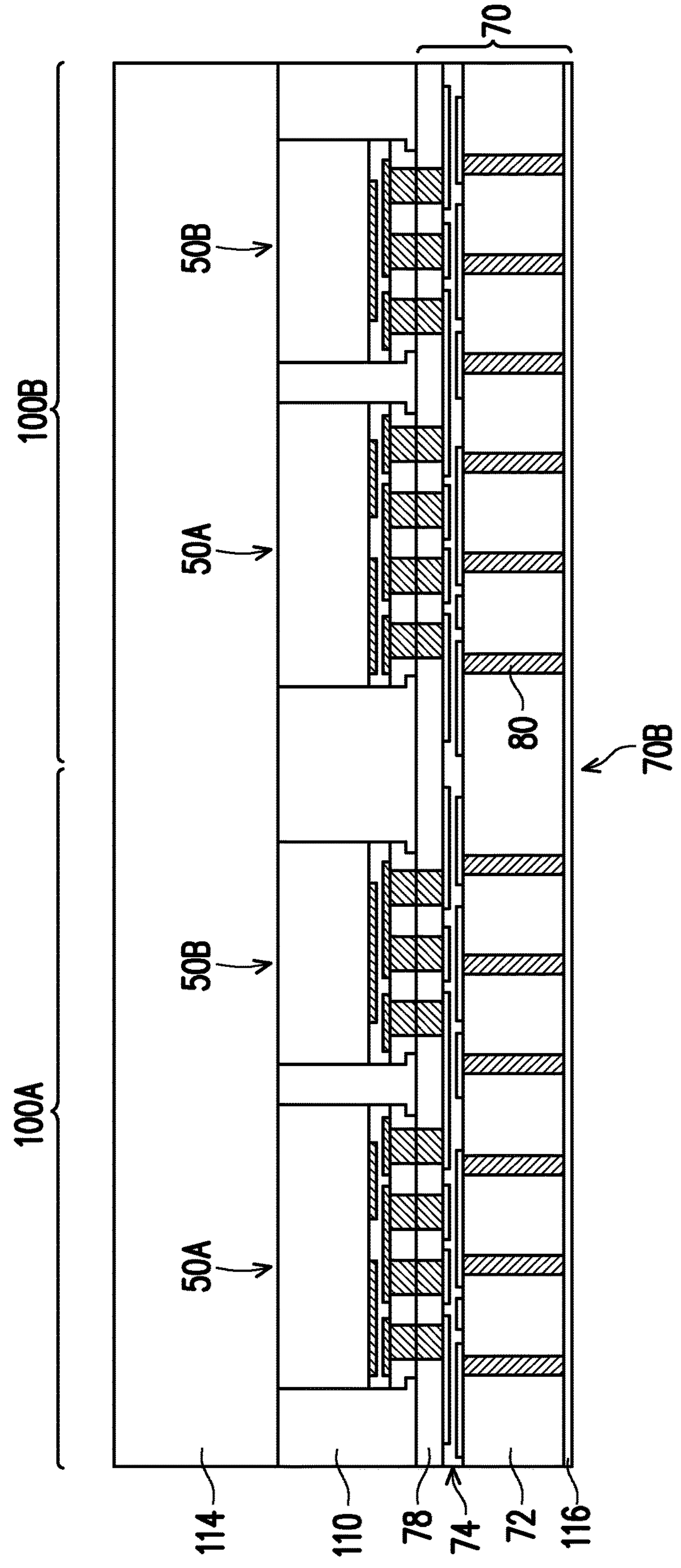

In FIG. 8, the substrate 72 is thinned to expose the conductive vias 80. Exposure of the conductive vias 80 may be accomplished by a thinning process, such as a grinding process, a CMP, an etch-back, combinations thereof, or the like. An insulating layer 116 is then formed on the back surface of the substrate 72, over the conductive vias 80. In some embodiments, the insulating layer 116 is formed from a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like.

Figure 9:
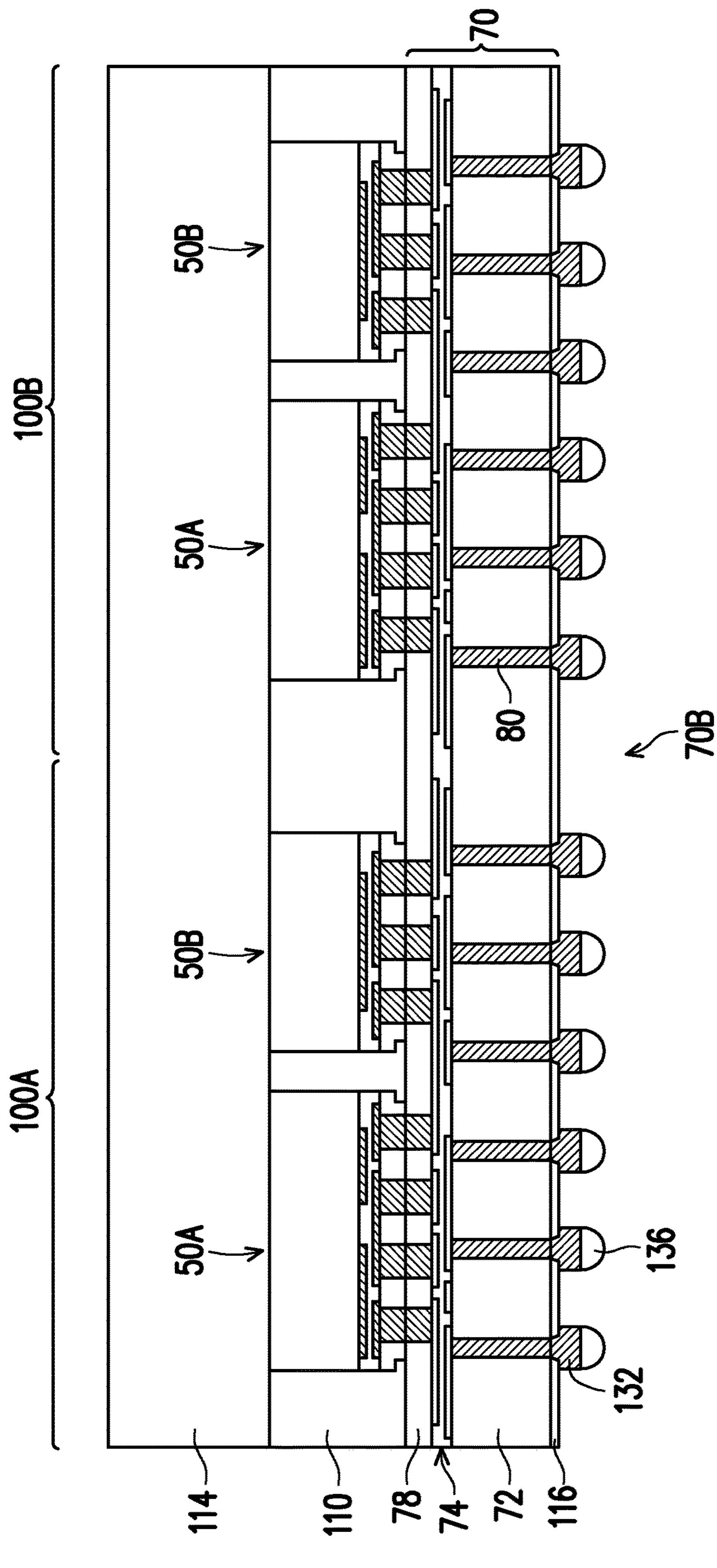

In FIG. 9, under bump metallurgies (UBMs) 132 are formed on and extending through the insulating layer 116. The UBMs 132 may be electrically connected to the conductive vias 80. As an example to form the UBMs 132, openings may be patterned in the insulating layer 116 to expose the conductive vias 80. Patterning the openings may be achieved by a combination of photolithography and etching in some embodiments. In other embodiments, the openings in the insulating layer 116 may be achieved by laser drilling, for example. A seed layer (not illustrated) is formed in the openings, such as over the exposed surfaces of the conductive vias 80 and the insulating layer 116. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 132. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 132.

Further, conductive connectors 136 are formed on the UBMs 132. The conductive connectors 136 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 136 may include a conductive material such as solder, copper, aluminum, gold, nickel, silver, palladium, tin, the like, or a combination thereof. In some embodiments, the conductive connectors 136 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 136 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In FIG. 10, a carrier debonding is performed to detach (debond) the carrier substrate 114 from the encapsulant 110 and the integrated circuit dies 50. In embodiments where the carrier substrate 114 is attached to the encapsulant 110 and the integrated circuit dies 50 by a release layer, the debonding includes projecting a light such as a laser light or an ultraviolet (UV) light on the release layer so that the release layer decomposes under the heat of the light and the carrier substrate 114 can be removed. The structure is then flipped over and placed on a tape (not illustrated).

Subsequently, a singulation process is performed by cutting along scribe line regions, e.g., between the package regions 100A, 100B. The singulation process may include sawing, laser drilling, plasma dicing, or the like. For example, the singulation process can include sawing the insulating layer 116, the encapsulant 110, the insulating bonding layer 78, the interconnect structure 74, and the substrate 72. The singulation process singulates the package regions 100A, 100B from one another. The resulting, singulated integrated circuit package 100 is from one of the package regions 100A, 100B. The singulation process forms interposers 140 from the singulated portions of the wafer 70 and the insulating layer 116. The interposers 140 can be passive interposers free of active devices (e.g., transistors, diodes, or the like) or active interposers having active devices disposed therein. Each of the integrated circuit packages 100 includes an interposer 140. As a result of the singulation process, the outer sidewalls of the interposer 140 and the encapsulant 110 are laterally coterminous (within process variations).

In FIG. 11, the integrated circuit package 100 is then flipped and attached to a package substrate 200 using the conductive connectors 136. The package substrate 200 includes a substrate core 202, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 202 may be a SOI substrate. Generally, an SOI substrate includes a layer of a semiconductor material such as epitaxial silicon, germanium, silicon germanium, SOI, SGOI, or combinations thereof. The substrate core 202 is, in one alternative embodiment, an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate core 202.

The substrate core 202 may include active and passive devices (not illustrated). Devices such as transistors, capacitors, resistors, combinations of these, and the like may be used to generate the structural and functional requirements of the design for the system. The devices may be formed using any suitable methods.

The substrate core 202 may also include metallization layers and vias (not illustrated) and bond pads 204 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, dual damascene, or the like). In some embodiments, the substrate core 202 is substantially free of active and passive devices.

The conductive connectors 136 are reflowed to attach the UBMs 132 to the bond pads 204. The conductive connectors 136 connect the integrated circuit package 100, including metallization patterns of the interconnect structure 74, to the package substrate 200, including metallization layers in the substrate core 202. Thus, the package substrate 200 is electrically connected to the integrated circuit dies 50. In some embodiments, passive devices (e.g., surface mount devices (SMDs), not illustrated) may be attached to the integrated circuit package 100 (e.g., bonded to the UBMs 132) prior to mounting on the package substrate 200. In such embodiments, the passive devices may be bonded to a same surface of the integrated circuit package 100 as the conductive connectors 136. In some embodiments, passive devices (e.g., SMDs, not illustrated) may be attached to the package substrate 200, e.g., to the bond pads 204.

In some embodiments, an underfill 206 is formed between the integrated circuit package 100 and the package substrate 200, surrounding the conductive connectors 136 and the UBMs 132. The underfill 206 may be formed by a capillary flow process after the integrated circuit package 100 is attached or may be formed by a suitable deposition method before the integrated circuit package 100 is attached. The underfill 206 may be a continuous material extending from the package substrate 200 to the interposer 140 (e.g., the insulating layer 116).

Optionally, a heat spreader 208 is attached to the integrated circuit package 100. The heat spreader 208 may be formed from a material with high thermal conductivity, such as steel, stainless steel, copper, the like, or combinations thereof. The heat spreader 208 may include a thermal lid 208A and a ring 208B, which may be attached to the integrated circuit package 100 by an adhesive or a thermal interface material (TIM). IN some embodiments, the ring 208B may encircle the integrated circuit package 100 in a top down view. The heat spreader 208 protects the integrated circuit package 100 and forms a thermal pathway to conduct heat from the various components of the integrated circuit package 100 (e.g., the integrated circuit dies 50). The heat spreader 208 is in contact with the integrated circuit dies 50 and the encapsulant 110.

According to various embodiments, integrated circuit packages are formed by directly bonding integrated circuit dies to a wafer that contains another device, such as an interposer or another integrated circuit die, and a molding compound is dispensed around the integrated circuit dies as an encapsulant. Stress relief features are formed in the integrated circuit dies prior to bonding, for example, during an integrated circuit die singulation process. The stress relief features may include relatively shallow ledges that are formed in at least an insulating bonding layer of the integrated circuit dies by, for example, plasma dicing. The ledges provide artificial delamination surfaces in the integrated circuit dies, which can be adhered to the underlying interposer by the molding compound. As a result, bonding interface stress can be reduced and adhesion is improved.

Further, corners of the insulating bonding layer may have a chamfer shape in a top-down view. For example, the corners of the insulating bonding layer may be notched a result of the dicing process to form the relatively shallow recess, and the corners of the insulating bonding layer may be free of any right angles, which further reduces stress in the bonded package. It has been observed that embodiment packages including such shallow recesses can result in up to 50% stress reduction at low temperature conditions and up to 90% stress reduction at high temperature conditions. Accordingly, various embodiments provide semiconductor packages with reduced stress and improved bonding integrity.

In some embodiments, a package includes an integrated circuit die comprising a first insulating bonding layer and a first semiconductor substrate and an interposer comprising a second insulating bonding layer and a second semiconductor substrate. The second insulating bonding layer is directly bonded to the first insulating bonding layer with dielectric-to-dielectric bonds. The package further includes an encapsulant over the interposer and surrounding the integrated circuit die, wherein the encapsulant is further disposed between the first insulating bonding layer and the second insulating bonding layer along a line perpendicular to a major surface of the first semiconductor substrate. In some embodiments, the first insulating bonding layer has a chamfer-shaped corner in a top-down view. In some embodiments, the first semiconductor substrate has a right-angle corner in a top-down view. In some embodiments, the encapsulant further extends into an interface between the first insulating bonding layer and the second insulating bonding layer. In some embodiments, the encapsulant comprises filler materials, and the filler materials are disposed between the first insulating bonding layer and the second insulating bonding layer along the line perpendicular to a major surface of the first semiconductor substrate. In some embodiments, the package further includes a void in the encapsulant, wherein the void is disposed between the first insulating bonding layer and the second insulating bonding layer along the line perpendicular to a major surface of the first semiconductor substrate. In some embodiments, the package further includes first bonding pads in the first insulating bonding layer; and second bonding pads in the second insulating bonding layer, wherein the first bonding pads are directly bonded to the second bonding pads with metal-to-metal bonds.

In some embodiments, a method includes singulating a first integrated circuit die from a second integrated circuit die, wherein singulating the first integrated circuit die comprises: performing a plasma dicing process to define a first recess in a first insulating bonding layer, wherein the first insulating bonding layer is disposed over a semiconductor substrate, and wherein a bottom surface of the first recess is above a top surface of the semiconductor substrate; and performing a sawing process through the first recess and the semiconductor substrate to separate the first integrated circuit die from the second integrated circuit die. The method further includes directly bonding the first integrated circuit die to an interposer, wherein the first insulating bonding layer is directly bonded to a second insulating bonding layer of the interposer by dielectric-to-dielectric bonding; and encapsulating the first integrated circuit die with an encapsulant, wherein encapsulating the first integrated circuit die comprises dispensing the encapsulant into a gap between the first insulating bonding layer and the second insulating bonding layer. In some embodiments, singulating the first integrated circuit die further comprises: after performing the plasma dicing process and prior to performing the sawing process, performing a grooving process to define a groove connected to the first recess, wherein the groove extends into the semiconductor substrate. In some embodiments, the first recess has a depth in a range of 5 kÅ to 2.5 μm. In some embodiments, a length of the gap is in a range of 1 μm to 250 μm. In some embodiments, the plasma dicing process defines a chamfer-shaped corner in the first insulating bonding layer. In some embodiments, an interconnect structure is disposed between the semiconductor substrate and the first insulating bonding layer, and the first recess extends into an insulating layer of the interconnect structure. In some embodiments, encapsulating the first integrated circuit die comprises dispensing the encapsulant into an interface between the first insulating bonding layer and the second insulating bonding layer. In some embodiments, dispensing the encapsulant into the gap between the first insulating bonding layer and the second insulating bonding layer comprises forming a void in the encapsulant between the first insulating bonding layer and the second insulating bonding layer.

In some embodiments, a package includes an interposer; an integrated circuit die over the interposer; and an encapsulant over the interposer and around the integrated circuit die. The integrated circuit die includes a first insulating bonding layer and a semiconductor substrate, wherein the first insulating bonding layer of the integrated circuit die is directly bonded to a second insulating bonding layer of the interposer with dielectric-to-dielectric bonds, and the first insulating bonding layer has a chamfer-shaped corner that is laterally displaced with an outer sidewall of the semiconductor substrate. In some embodiments, a first portion of the encapsulant is disposed between the first insulating bonding layer and the second insulating bonding layer, and wherein the first portion of the encapsulant extends laterally from the chamfer-shaped corner to the outer sidewall of the semiconductor substrate. In some embodiments, a thickness of the first portion of the encapsulant is in range of 5 kÅ to 2.5 μm. In some embodiments, a length of the first portion of the encapsulant is in a range of 1 μm to 250 μm. In some embodiments, roughness of an interface between the first insulating bonding layer and the second insulating bonding layer is different from a roughness of an interface between the first insulating bonding layer and the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

singulating a first integrated circuit die from a second integrated circuit die, wherein singulating the first integrated circuit die comprises:

performing a plasma dicing process to define a first recess in a first insulating bonding layer, wherein the first insulating bonding layer is disposed over a semiconductor substrate, and wherein a bottom surface of the first recess is above a top surface of the semiconductor substrate; and performing a sawing process through the first recess and the semiconductor substrate to separate the first integrated circuit die from the second integrated circuit die;

directly bonding the first integrated circuit die to an interposer, wherein the first insulating bonding layer is directly bonded to a second insulating bonding layer of the interposer by dielectric-to-dielectric bonding; and encapsulating the first integrated circuit die with an encapsulant, wherein encapsulating the first integrated circuit die comprises dispensing the encapsulant into a gap between the first insulating bonding layer and the second insulating bonding layer.

2. The method of claim 1, wherein singulating the first integrated circuit die further comprises:

after performing the plasma dicing process and prior to performing the sawing process, performing a grooving process to define a groove connected to the first recess, wherein the groove extends into the semiconductor substrate.

3. The method of claim 1, wherein the first recess has a depth in a range of 5 kÅ to 2.5 μm.

4. The method of claim 1, wherein a length of the gap is in a range of 1 μm to 250 μm.

5. The method of claim 1, wherein the plasma dicing process defines a chamfer-shaped corner in the first insulating bonding layer.

6. The method of claim 1, wherein an interconnect structure is disposed between the semiconductor substrate and the first insulating bonding layer, and wherein the first recess extends into an insulating layer of the interconnect structure.

7. The method of claim 1, wherein encapsulating the first integrated circuit die comprises dispensing the encapsulant into an interface between the first insulating bonding layer and the second insulating bonding layer.

8. The method of claim 1, wherein dispensing the encapsulant into the gap between the first insulating bonding layer and the second insulating bonding layer comprises forming a void in the encapsulant between the first insulating bonding layer and the second insulating bonding layer.

9. A method comprising:

bonding an integrated circuit die to an interposer, wherein the integrated circuit die comprises a first insulating bonding layer and a first semiconductor substrate, wherein the interposer comprises a second insulating bonding layer and a second semiconductor substrate, wherein the second insulating bonding layer is bonded to the first insulating bonding layer with dielectric-to-dielectric bonds, wherein after bonding the integrated circuit die to the interposer with dielectric-to-dielectric bonds, a gap is disposed between the integrated circuit die and the interposer and surrounding a periphery of the first insulating bonding layer in a plan view; and forming an encapsulant over the interposer and surrounding the integrated circuit die, wherein forming the encapsulant comprises dispensing the encapsulant into the gap between the first insulating bonding layer and the second insulating bonding layer such that the encapsulant is partially disposed between the first insulating bonding layer and the second insulating bonding layer along a line perpendicular to a major surface of the first semiconductor substrate.

10. The method of claim 9, further comprising singulating the integrated circuit die from a plurality of integrated circuit dies, wherein singulating the integrated circuit die comprises forming a chamfer-shaped corner in the first insulating bonding layer in a top-down view.

11. The method of claim 10, wherein the first semiconductor substrate has a right-angle corner in a top-down view after singulating the integrated circuit die from the plurality of integrated circuit dies.

12. The method of claim 9, wherein forming the encapsulant comprises dispensing the encapsulant into an interface between the first insulating bonding layer and the second insulating bonding layer.

13. The method of claim 9, wherein the encapsulant comprises filler materials, and wherein the filler materials are disposed between the first insulating bonding layer and the second insulating bonding layer along the line perpendicular to the major surface of the first semiconductor substrate.

14. The method of claim 9, further comprising forming a void in the encapsulant, wherein the void is disposed between the first insulating bonding layer and the second insulating bonding layer along the line perpendicular to the major surface of the first semiconductor substrate.

15. The method of claim 9, wherein bonding the integrated circuit die to the interposer further comprises:

bonding first bonding pads to second bonding pads with metal-to-metal bonding, wherein the first bonding pads are in the first insulating bonding layer, and wherein the second bonding pads are in the second insulating bonding layer.

16. The method of claim 9 further comprising singulating the integrated circuit die from a plurality of integrated circuit dies, wherein singulating the integrated circuit die comprises:

performing a plasma dicing process to define a first recess in the first insulating bonding layer, wherein the first insulating bonding layer is disposed over a semiconductor substrate, and wherein a bottom surface of the first recess is above a top surface of the semiconductor substrate; and performing a sawing process through the first recess and the semiconductor substrate to separate the integrated circuit die from the plurality of integrated circuit dies.

17. A method comprising:

forming an interconnect structure over a semiconductor substrate;

depositing a first insulating bonding layer over the interconnect structure;

performing a plasma dicing process to define a first recess in a first insulating bonding layer;

performing a sawing process through the first recess and the semiconductor substrate to form a first package component, wherein the plasma dicing process and the sawing process define a ledge that surrounds the first insulating bonding layer in a plan view; and after performing the sawing process, bonding the first insulating bonding layer of the first package component to a second insulating bonding layer of a second package component by dielectric-to-dielectric bonding.

18. The method of claim 17, wherein after bonding the first insulating bonding layer of the first package component to the second insulating bonding layer of the second package component, a gap is defined between the ledge and the second insulating bonding layer.

19. The method of claim 18, further comprising forming an encapsulant around the first package component, wherein forming the encapsulant comprises dispensing a portion of the encapsulant to fill the gap.

20. The method of claim 17, wherein after the plasma dicing process, the first insulating bonding layer has a chamfered corner in a plan view.

* * * * *